United States Patent [19]
Locke et al.

[11] Patent Number: 5,436,555
[45] Date of Patent: Jul. 25, 1995

[54] LAN CABLE IDENTIFIER FOR TESTING LOCAL AREA NETWORK CABLES

[75] Inventors: Thomas P. Locke, Woodinville; Tzafrir Sheffer, Seattle, both of Wash.

[73] Assignee: Fluke Corporation, Everett, Wash.

[21] Appl. No.: 257,597

[22] Filed: Jun. 9, 1994

[51] Int. Cl.⁶ .............................................. G01R 31/02
[52] U.S. Cl. ...................... 324/66; 324/133; 324/539; 379/26
[58] Field of Search ................ 324/66, 67, 133, 539, 324/555; 379/25, 26

[56] References Cited

FOREIGN PATENT DOCUMENTS

| | | | |
|---|---|---|---|
| 0144560 | 11/1980 | Japan | 324/66 |
| 0238930 | 10/1991 | Japan | 324/539 |
| 0709737 | 9/1952 | United Kingdom | 324/66 |
| 2234598 | 2/1991 | United Kingdom | 324/539 |

*Primary Examiner*—Kenneth A. Wieder
*Assistant Examiner*—Diep Do
*Attorney, Agent, or Firm*—George T. Noe

[57] ABSTRACT

A LAN cable identifier for testing and identifying copper-conductor LAN cables in conjunction with a LAN cable test instrument is provided. Series combinations of resistors and diodes allow for both resistance measurements and polarity determinations for selected pairs of conductors of the LAN cable. Resistance values are chosen to allow for identification of each combination in order to diagnose wiring errors and to identify the particular LAN cable identifier. In addition, capacitance measurements are accommodated with minimal contribution to measurement error by careful orientation of the resistors and diodes so that the diodes may be reverse biased by a d.c. bias voltage provided by the LAN cable test instrument. The reverse biased diode junctions contribute only a small amount of shunt capacitance to the measurement.

3 Claims, 8 Drawing Sheets

LAN CABLE IDENTIFIER FOR TESTING LOCAL AREA NETWORK CABLES

BACKGROUND OF THE INVENTION

This invention relates generally to devices employed in the testing of local area network (LAN) cables and in particular to an apparatus which facilitates the testing of copper-conductor LAN cables by providing a LAN cable termination with a set of predetermined electrical parameters for testing by a LAN cable test instrument.

Local area networks (LAN's) now connect a vast number of personal computers, workstations, printers, and file servers in the modem office. A LAN system is typically implemented by physically connecting all of these devices with copper-conductor twisted-pair LAN cables, the most common being an 8-wire cable which is configured as 4 twisted-wire pairs. LAN cables sometimes include a flexible foil wrapper that acts as an electrostatic shield. Each end of the LAN cable is terminated in an industry-standard connector. In a typical installation, LAN cables may be routed through walls, floors, and ceilings of the building. LAN cable systems require constant maintenance, upgrades, and troubleshooting because LAN cables and connectors are subject to breakage, offices and equipment must be moved, and new equipment is added.

The tasks of installing, replacing, or re-routing cables typically fall on a professional cable installer or in-house network maintenance person. During the installation phase, each cable is routed through the building and a connector is attached to each end of the new cable. Each wire in the cable must be connected to its proper respective electrical connection on both ends of the cable in order for the LAN connection to function. A variety of LAN cables are used in the industry, including: unshielded twisted pair ("UTP"), shielded twisted pair ("STP"), and coaxial cables. LAN cable installation practices, cable performance specifications, and building wiring practices are governed by the Electronic Industries Association Commercial Building Telecommunications Wiring Standard EIA/TIA-568.

Lower cost LAN cable test instruments, often called "cable mappers" in the industry, are essentially specialized ohmmeters equipped to test industry-standard terminations and wire maps according to EIA/TIA-568. The end of the LAN cable system in which the test instrument is applied is the "near-end". The other end of the LAN cable thereby becomes the "far-end". The LAN cable test instrument is connected to the LAN cable at the near-end and the cable identifier is connected to the far-end of the cable to facilitate a known return path for the d.c. test current provided by the LAN cable test instrument for each specified wire pair. The instrument automatically performs a series of resistance measurements, hereby relieving the operator of the burden of probing individual connections manually, to ensure that all the connections exist in the appropriate wires as required by industry standards and to provide the operator with a visual indication of continuity and proper connection of each wire pair through the cable.

The LAN cable identifier, operating in conjunction with a LAN cable test instrument, aids in the diagnosis and troubleshooting of a LAN cable system by providing a number of predetermined signal paths at the far-end of the cable so that the intervening LAN cable and LAN cable connectors that make up a LAN cable system may be tested by the LAN cable test instrument. The more predetermined signal paths the cable identifier provides, the more desirable the cable identifier is for the user as a tool in identifying and troubleshooting any of a number of possible errors that may occur singly or in combination in the LAN cable system.

Prior art LAN cable identifiers provide predetermined parameters which the LAN cable test instrument can use in detecting open-circuit, short-circuit, crossed-pair, and polarity-reversal errors by providing a known return path for the expected wire pairs which can be measured by the LAN cable test instrument and compared to expected measurement values. Another feature is to allow for the unique identification of a particular cable by providing some unique measurement parameter to the LAN cable test instrument. Furthermore, LAN cable identifiers allow testing for crossed wire pair errors by assigning a unique electrical parameter to each of the wire pairs which depends on the polarity of the test signal from the LAN cable test instrument and comparing the measurement to expected values for that wire pair.

Additional capability to diagnose LAN cable errors beyond the open-circuit, short-circuit, crossed-pair, and polarity-reversal errors, particularly those wiring errors that occur between pairs ("inter-pair wiring errors") would be desirable. Rather than simply indicating to the user that there is an unknown wiring fault, there would be provided more complete information as to the nature of the error. Such diagnostic information is made possible by providing to the LAN cable test instrument a unique electrical parameter that represents a particular intra-pair wiring error in the LAN cable system.

Furthermore, it would be desirable to more reliably provide valid electrical parameters to the LAN cable test instrument in a manner that is more tolerant of multiple wiring errors in the LAN cable system. Finally, when working in conjunction with a LAN cable test instrument that measures the capacitance of the LAN cable system in addition to measuring the resistance, it would be desirable that the LAN cable identifier not substantially affect capacitance measurements while continuing to provide resistance measurements without the use of active switching methods which require external power supplies or batteries to operate.

SUMMARY OF THE INVENTION

In accordance with the present invention, a LAN cable identifier to assist in the troubleshooting and verification of copper-wire LAN cables by providing a predetermined set of electrical parameters to a LAN cable test instrument is provided using a network of series diode-resistor combinations coupled between the various connections of a LAN cable connector. The diode-resistor combinations, known as circuit elements, are classified into three separate types which provide for detecting and diagnosing different types of wiring errors.

Intra-pair circuit elements compose the first type. Wire pairs 1-2, 3-6, 4-5, and 7-8 are the expected wire pings according to industry standards. Circuit elements are connected between pins 1 and 2, 3 and 6, 4 and 5, and 7 and 8 of the LAN cable connector which are in turn coupled to corresponding wires in the LAN cable, allowing the verification of the correct connections of the predetermined wire pairs in several ways. First, each diode provides for detecting polarity reversal errors because the diode conducts in one direction of the d.c. (direct current) test current provided by the LAN cable test instrument but does not conduct in the other. A polarity reversal error can then be detected by comparing the polarity of current conduction with the expected polarity. Second, each of the resistors has a unique, predetermined resistance value which serves to identify the respective pair, so that crossed-pair errors may be detected by comparing the measured resistance value to the expected resistance value in the LAN cable test instrument.

Finally, to identify a particular LAN cable system, a LAN cable identifier assigned a unique number is coupled to the far-end of a LAN cable system. Resistance values measured by the LAN cable test instrument at the near-end are compared against the unique resistance values assigned to corresponding LAN cable identifier numbers which are so marked on the exterior of the LAN cable identifier. The corresponding number is indicated visually to the operator of the LAN cable test instrument to expedite the connection of the proper LAN cable test system.

Inter-pair circuit elements form the second type of diode-resistor combination. Wiring errors that cause unwanted cross connections between desired wire pairs, such as transposing wires 1 and 4 at one end of the LAN cable affected desired wire pairs 1-2 and 4-5, although easy to detect as a fault using intra-pair circuit elements, are more difficult to diagnose as to what the nature of the error actually is because no meaningful electrical parameters can be measured by the LAN cable test instrument. Adding inter-pair circuit elements increases the ability of the LAN cable test instrument to diagnose the nature of the wiring error and provides the user with a more useful and complete diagnosis. An inter-pair circuit element provides a predetermined electrical parameter measured by the LAN cable test instrument that indicates a particular type of wiring error. For example, inter-pair circuit elements assigned predetermined values and coupled between pins 1 and 4 and another between pins 2 and 5 of the LAN cable connector would allow the LAN cable test instrument to diagnose the nature of the wiring error involving the transposition of wires 1 and 5 by comparing the electrical parameters returned to a predetermined set of electrical parameters. A message to the LAN cable test instrument user indicating that invalid wire pairs 1-4 and 2-5 were found could then be conveyed.

Shield circuit elements form the third type of diode-resistor combination which provides for testing the continuity of the electrostatic shield that surrounds the wires of some types of LAN cables in a manner similar to intra-pair circuit elements.

While providing the detection and analysis of wiring mapping functions in conjunction with the d.c. test current of the LAN cable test instrument, the LAN cable identifier must not substantially interfere with capacitance measurements performed by that instrument. During a capacitance measurement, the LAN cable test instrument provides an a.c. (alternating current) test signal which is superimposed on a d.c. bias level in order to test the capacitance between any two wires of the LAN cable system. The d.c. bias voltage is provided to reverse bias the diode of the circuit element that is connected across the pair of wires being testing. Reverse-biased diodes electrically resemble a very small capacitor, thereby allowing the series diode resistor combination to remain connected while not substantially interfering with the capacitance measurement of the LAN cable system. The intra-pair circuit elements, inter-pair circuit elements, and shield circuit elements coupled to any wire pair of the LAN cable connector are arranged in such a way that circuit elements that are coupled to either wire of the wire pair being tested do not significantly contribute parasitic current paths that would degrade the accuracy of electrical parameter returned by the circuit element that is connected in shunt with the wire pair. Furthermore, the intra-pair, inter-pair, and shield circuit elements are arranged in number and orientation such that valid measurement parameters may still be obtained in the presence of short-circuit errors in the LAN cable system that affects other pairs of wires.

One feature of the present invention is to provide an apparatus for troubleshooting and verification of copper-conductor local area network (LAN) cable systems, working in conjunction with a LAN cable test instrument.

Another feature of the present invention is to provide extended wiring error detection and diagnosis capabilities which includes wiring errors between wire pairs.

A further feature of the present invention is to provide for d.c. resistance measurements while allowing for a.c. capacitance measurements.

An additional feature of the present invention is to provide for the return of valid measurement parameters to the LAN cable test instrument in the presence of wiring errors affecting other wire pairs.

Other features, attainments, and advantages will become apparent to those skilled in the art upon a reading of the following description when taken in conjunction with the accompanying drawings.

DETAILED DESCRIPTION OF THE INVENTION

Figure 1A:
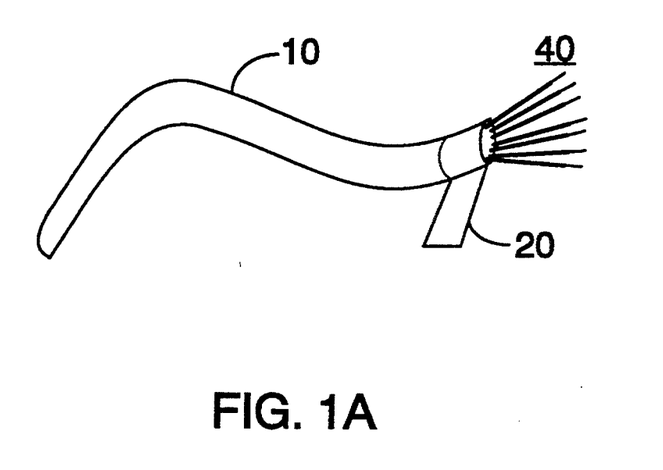
FIGS. 1A and 1B are respectively an illustration of a physical copper-conductor LAN cable and LAN cable connector.
Figure 1B:
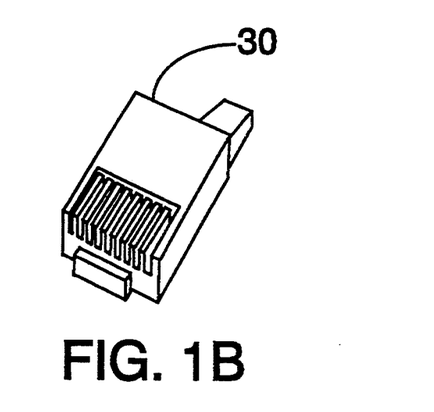

Referring to FIG. 1A and FIG. 1B, there is shown generally a LAN cable 10 which contains insulated copper-conductor wires 40 which commonly number between four and eight. The insulation on the wires 40 is color-coded according to industry standards in order to facilitate proper connections of the wires 40 to a connector 30. The wires are twisted together into wire pairs within the LAN cable 10 to order to maximize the electrical isolation of each pair from the other pairs. The twist rate and other electrical and mechanical parameters are specified and well known in the industry for data grade LAN cables. The LAN cable 10 may be shielded, meaning that a shield 20 surrounds the wires of the cable as a conductive sheath to reduce susceptibility to external interference and also to reduce the electromagnetic emissions from the cable induced by the data transmission. The connector 30 is typically an eight-conductor telephone-type connector commonly referred to in the industry as an RJ-45 connector.

Figure 2:
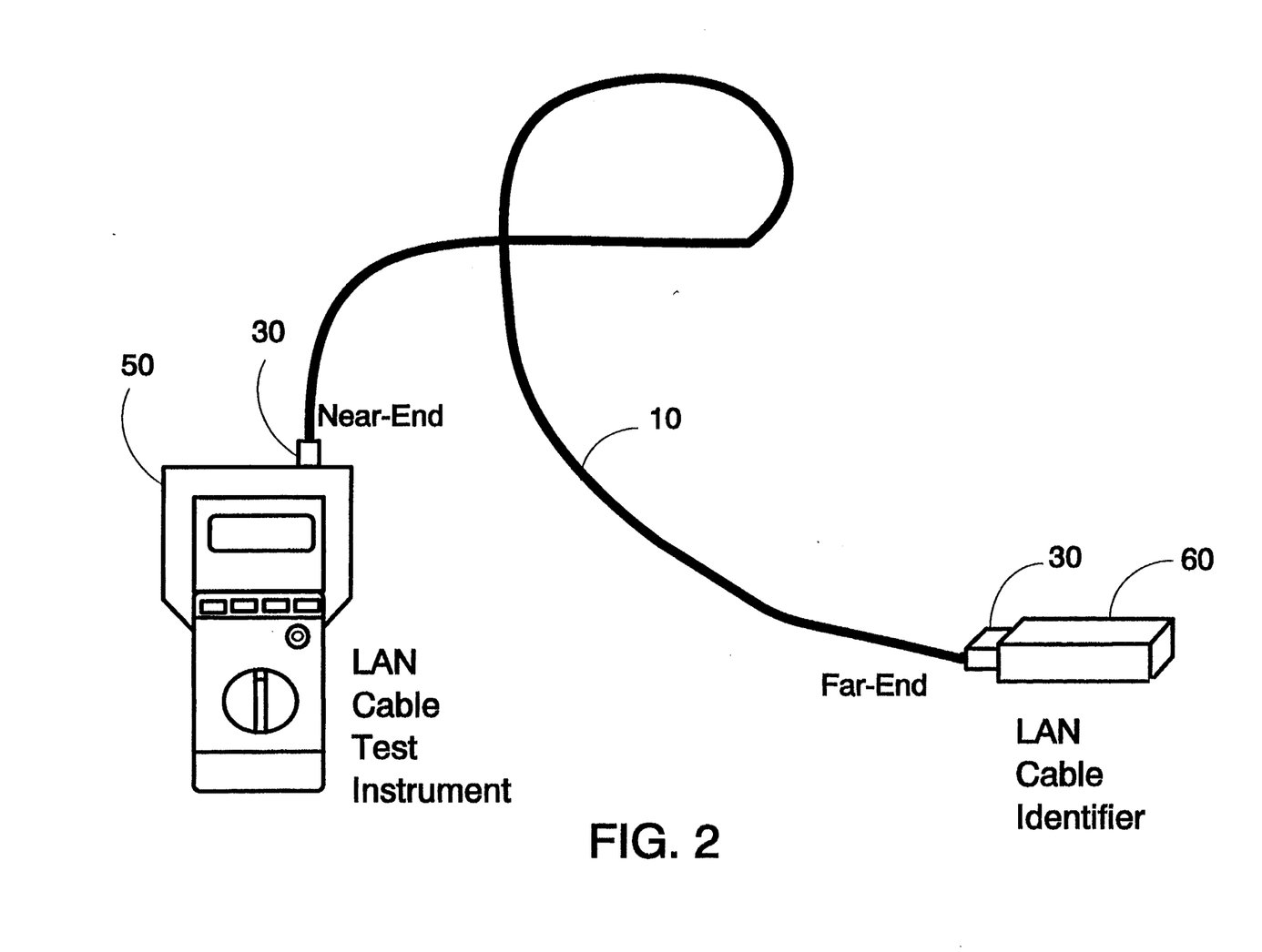
FIG. 2 is an illustration of a LAN cable test instrument and LAN cable identifier being used to test a LAN cable system.

In FIG. 2, there is shown a test configuration in the which the completed LAN cable system, comprised of the LAN cable 10 with connectors 30 attached to both ends, is tested with a LAN cable test instrument 50 connected at the "near-end" and the LAN cable identifier 60 at the "far-end" of the LAN cable system. LAN cable test instrument 50 may consist of any test instrument capable of measuring basic circuit parameters such as resistance and capacitance but more typically involves a specialized instrument tailored to the application of LAN cable testing and to the LAN cable identifier 60. An exemplary LAN cable test instrument capable of performing as discussed herein is described in U.S. patent application Ser. No. 08/222,156, filed Apr. 4, 1994, entitled "Instrument and Method for Testing Local Area Network Cables." A typical installation involves multiple LAN cables 10, often with cable runs of 50 meters or more in length, with all the cables terminating in a central location. After the LAN cables 10 have been installed, connectors 30 are attached to either end of the cable. One of a set of LAN cable identifiers 60, which are uniquely numbered 1 through 8 corresponding to a set of predetermined electrical parameters that are detected by the LAN cable test instrument 50 in the commercial embodiment, is attached to the far-end of the LAN cable 10. At the near-end of the LAN cable 10, the LAN cable test instrument 50 is employed to identify which LAN cable 10 is being tested by reading the electrical parameters of the cable identifier 60 coupled to the far-end and comparing the measured value to a table of values corresponding to assigned LAN cable identifier numbers. The LAN cable test instrument 50 then provides the LAN cable identifier number to the technician to aid in the final connection of the LAN cable system to its intended destination.

Figure 3:
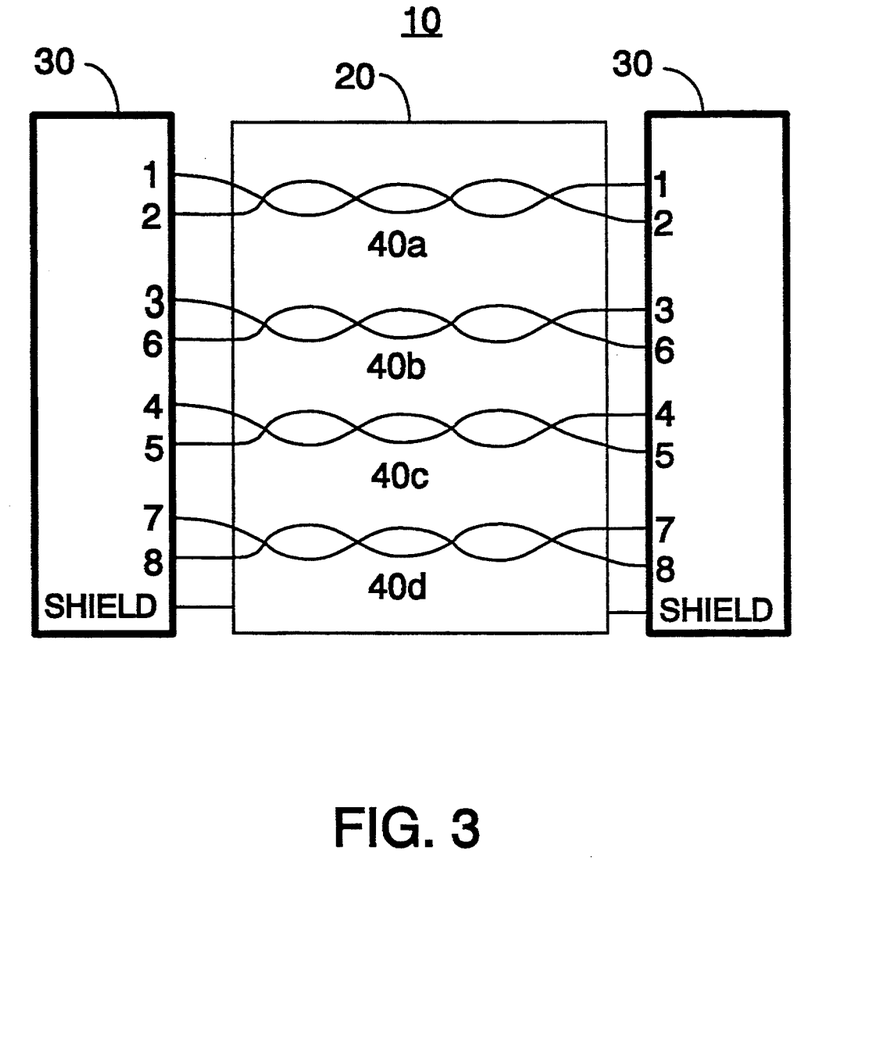
FIG. 3 is a circuit schematic of a LAN cable system consisting of a copper-conductor LAN cable and LAN cable connectors on either end showing the expected pairing of the wires.

Referring now to FIG. 3, a schematic diagram illustrates a complete and error free LAN cable system consisting of the LAN cable 10 and the connectors 30 coupled to both ends of the LAN cable 10. The wires 40 are connected as shown in conformance with the EIA/FIA-568 standard wherein a wire coupled to pin 1 of the connector 30 at the near-end is coupled to the corresponding pin 1 of the connector at the far-end of the LAN cable 10. A twisted wire pair consists of two individual wires that are twisted together along the length of the cable to achieve electromagnetic isolation from other twisted wire pairs in the cable and from external sources of interference. Wire pairs 1-2, 3-6, 4-5, and 7-8 are specified. A LAN cable 10 contains eight wires 40 typically formed as four twisted wire pairs. Other wire twist configurations, such as two bundles of four wires, may also be used to meet the objective of adequate inter-pair signal isolation between each of the four designated wire pairs in the LAN cable 10. The shield 20, if present in the LAN cable 10, is connected to the SHIELD connection of the connector 30 on both ends of the LAN cable 10.

Figure 4:
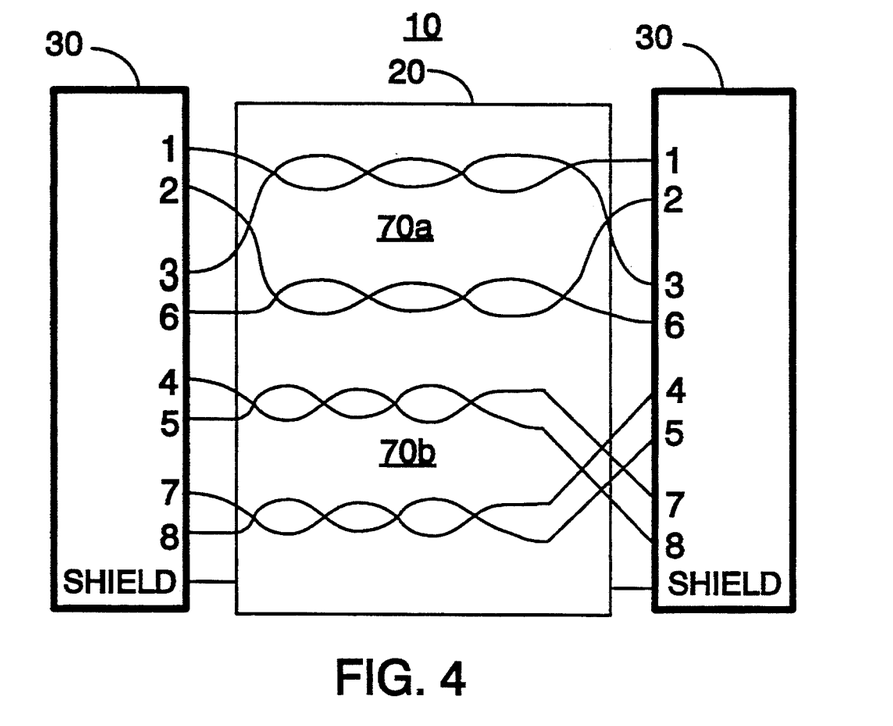
FIG. 4 is a circuit schematic of a LAN cable illustrating a split-pair wiring error and a crossed-pair wiring error.

FIG. 4 illustrates examples of several common wiring errors in a LAN cable system. Reversing the wires connected to connections 2 and 3 of the connector 30 on both ends of the cable creates a split-pair wiring error 70a which results in unacceptably poor signal isolation between the two data paths which is measured according to a parameter commonly known as "cross talk". Transposing two entire data paths, such as connections 4 and 5 for connections 7 and 8 on one end of the LAN cable 10 results in a crossed-pair wiring error 70b.

Figure 5:
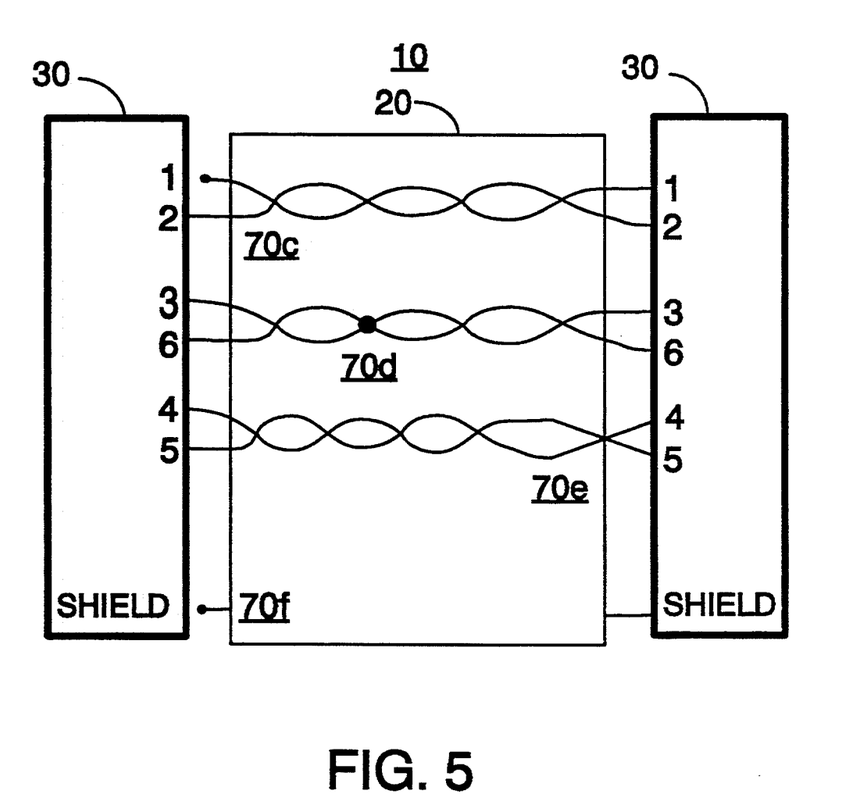
FIG. 5 is a circuit schematic of a LAN cable illustrating an open-circuit wiring error, a short-circuit wiring error, a polarity reversal wiring error, and an open-shield wiring error.

FIG. 5 further illustrates several more common wiring errors in a LAN cable system. An open circuit is a current path having a very high d.c. resistance, a condition normally expected between any pair of wires 40 of a LAN cable system with no terminations at the far-end that provide current paths. An open-circuit wiring error 70c can occur anywhere in the LAN cable system but is most commonly the result of failure of the wire 40 to make electrical contact at the connector 30. A short circuit is a current path having a relatively low d.c. resistance. A short-circuit wiring error 70d can occur between any two wires in the LAN cable system and may result from a defect in the wire insulation or as the result of the LAN cable 10 being physically crushed at some point along its length. Reversing the wires 40 of a wire pair at one end of the LAN cable 10 results in a polarity-reversal error 70e. If the shield 20 is present, a failure to make electrical contact between the shield 20 and the SHIELD contact of connector 30 is an open-shield error 70f.

Figure 6:
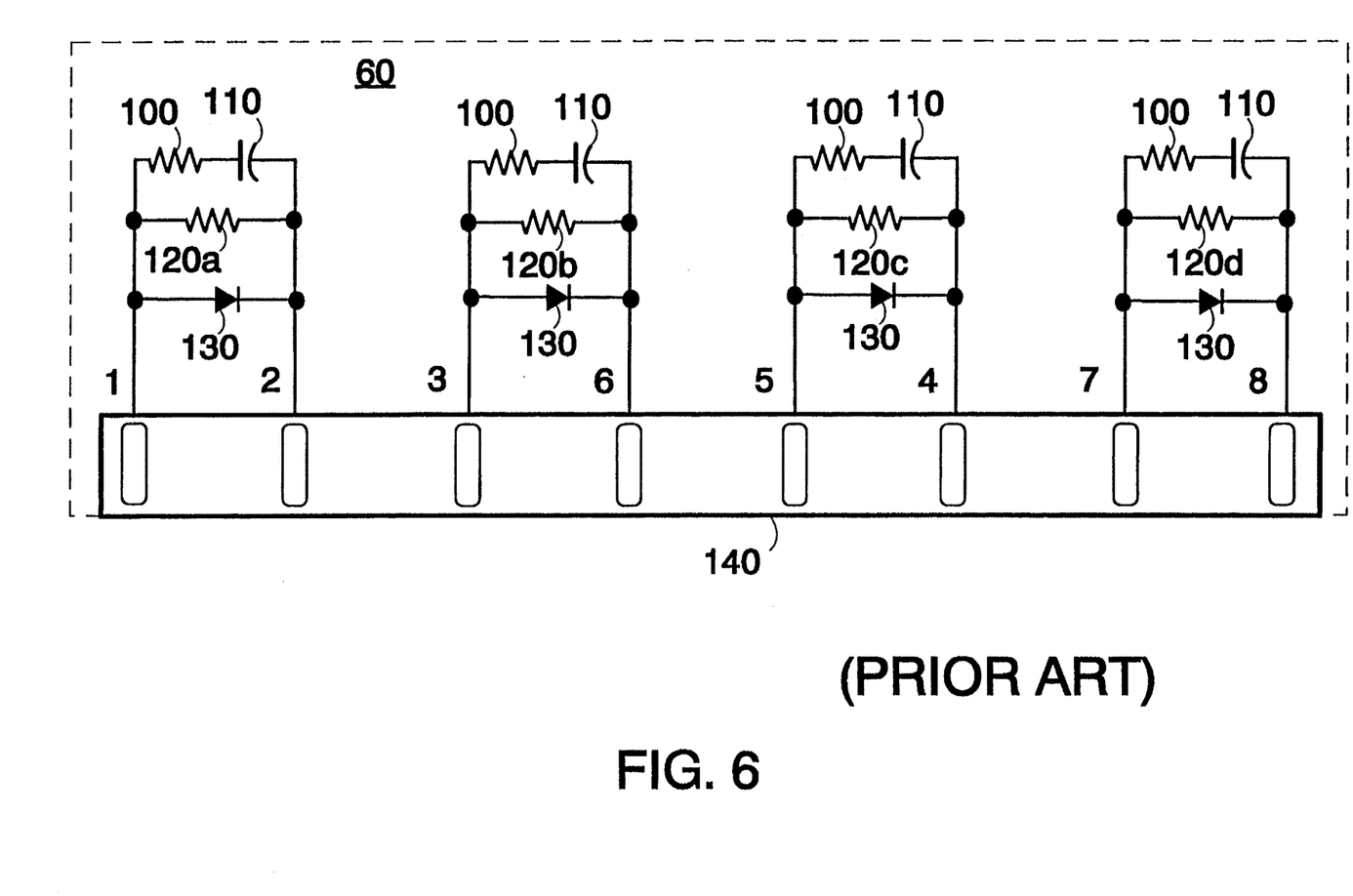
FIG. 6 is a circuit schematic of a LAN cable identifier according to the prior art.

A prior art LAN cable identifier 60 is shown in FIG. 6. For each of the pairs 1-2, 3-6, 5-4, and 7-8 which correspond to the desired wire pairs in the LAN cable system, an intra-pair circuit element is provided comprised of a diode 130 and a resistor 120. A series combination of a resistor 100 and a capacitor 110 are connected in shunt across each circuit element, functioning as a high frequency signal termination. Intra-pair circuit elements are coupled only to the desired wire pairs and provide predetermined electrical parameters to the LAN cable test instrument 50. The intra-pair circuit elements are coupled to a connector 140 which in turn is coupled to the connector 30 of the LAN cable system. For pair 1-2, as an example, an anode of the diode 130 is coupled to pin 1 of a connector 140 and the cathode is coupled to pin 2. The diode 120 allows the polarity reversal error 70e to be detected by providing a unidirectional current path in a predetermined direction which can be measured by the d.c. test current provided by the LAN cable test instrument 50. The resistor 100 is assigned a value of 100 ohms and provides a termination for a high frequency a.c. test signal with a typical frequency between 1 megahertz and 10 megahertz, provided by the LAN cable test instrument 50 to measure cross talk. The capacitor 110 is a blocking capacitor which prevents resistor 100 from interfering with the d.c. test functions. The other three intra-pair circuit elements and high frequency signal terminations, coupled to pins 3 and 6, 4 and 5, and 7 and 8, are constructed in a like manner.

The resistor 120 is coupled in shunt with the diode 130 and the series combination of the resistor 100 and capacitor 110. Between each of the four pairs, the resistor 120, sublabeled 120a-d, is assigned four unique resistance values predetermined for each respective pair which are measured by the LAN cable test instrument 50, allowing the crossed-pair error 70b, open circuit error 70c, or short-circuit error 70d to be detected by comparing the measured resistance value to the expected value.

Figure 7:
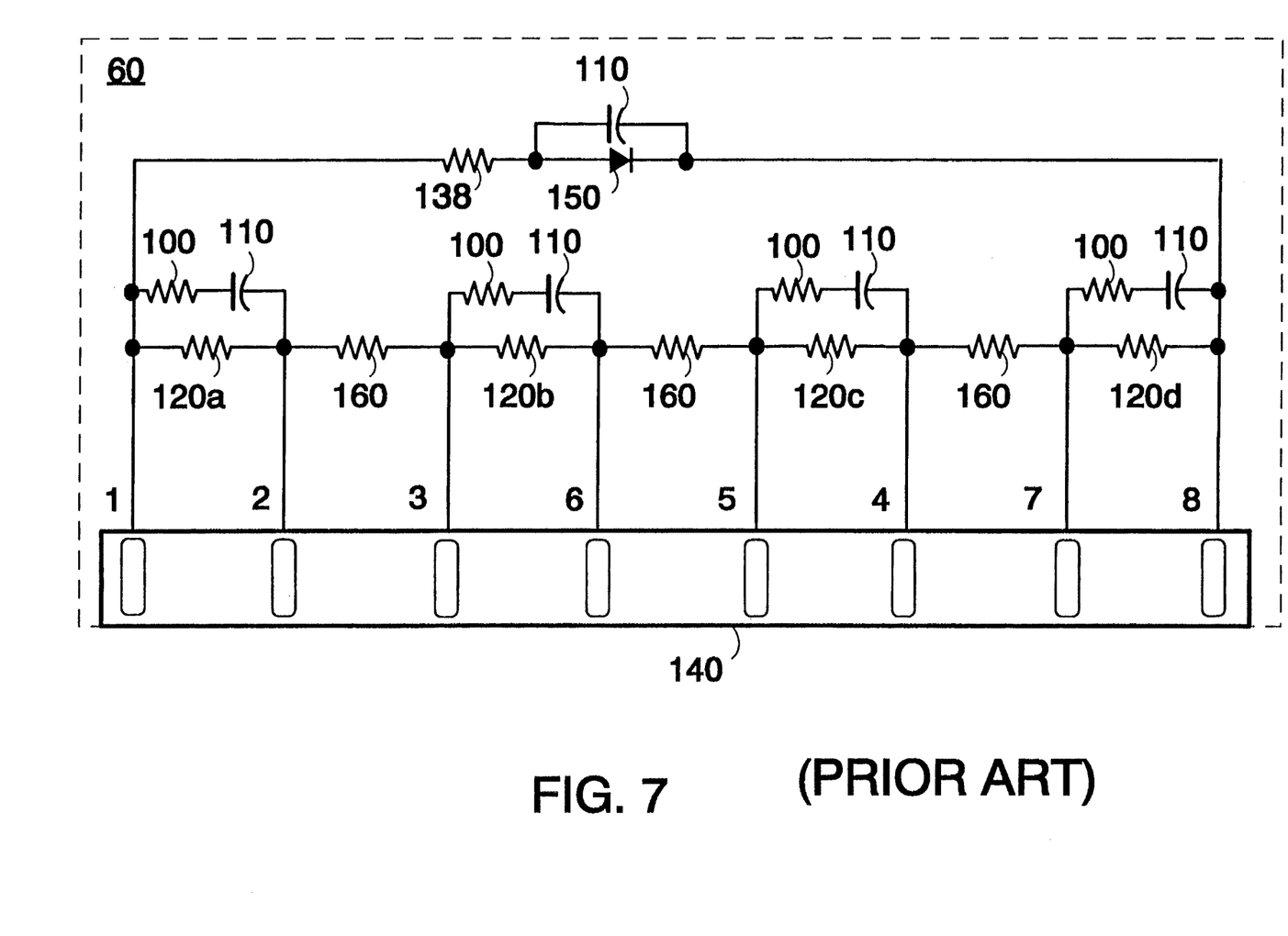
FIG. 7 is a circuit schematic of another LAN cable identifier according to the prior art.

Referring now to FIG. 7, there is shown a further example of a prior art LAN cable identifier 60. For each of the pairs 1-2, 3-6, 5-4, and 7-8 which correspond to the desired wire pairs in the LAN cable system, an intra-pair circuit element is provided comprised of the resistor 120a-d coupled to the connector 140 which in turn is coupled to the connector 30 of the LAN cable system which is assigned four unique resistance values predetermined for each respective pair which are measured by the LAN cable test instrument 50, allowing the crossed-pair error 70b, open circuit error 70c, or short-circuit error 70d to be detected by comparing the measured resistance value to the expected value. A series combination of the resistor 100 and the capacitor 110 are connected in shunt across each circuit element, functioning as a high frequency signal termination. The resistor 100 is assigned a value of 100 ohms and provides a termination for a high frequency a.c. test signal with a typical frequency between 1 megahertz and 10 megahertz, provided by the LAN cable test instrument 50 to measure cross talk. The capacitor 110 is a blocking capacitor which prevents resistor 100 from interfering with the d.c. test functions. The other three intra-pair circuit elements and high frequency signal terminations, coupled to pins 3 and 6, 4 and 5, and 7 and 8, are constructed in a like manner.

Inter-pair groups formed by resistors 160 are coupled between pins 2 and 3, 5 and 6, and 4 and 7 provide resistance values that indicate a crossed-pair error 70b involving two adjacent wire pairs, such as between pairs 1-2 and 3-6. A wiring error that involved a pairing of wires 2 and 3 at one end of the LAN cable system would be correctly diagnosed by LAN cable test instrument 50 because the resistance value provided by resistor 160 can be measured and compared against a table of predetermined values that indicate such wire errors.

Testing for the polarity reversal error 70e is provided by a resistor 138 and a diode 150 disposed in series between pins 1 and 8 of connector 140. A capacitor 110 in shunt with the diode 150 removes undesirable effects of diode rectification when the high frequency test signal is applied by the LAN cable test instrument 50. When evaluating the polarity of the wire pair 1-2, for example, the resistance provided by the LAN cable identifier 60 is the value of resistor 120a in one direction of the d.c. test current provided by the LAN cable test instrument 50 in which diode 150 is reverse biased. Reversing the direction of the test current, diode 150 is now forward biased and the value of resistance is now the value of resistor 120 in parallel with the series combination of the resistor 138, the three resistors 160, and resistors 120b-d. This difference in resistance measured by the LAN cable test instrument 50 between the two polarities of the applied bias voltage can be employed to detect the polarity reversal error 70e.

Figure 8:
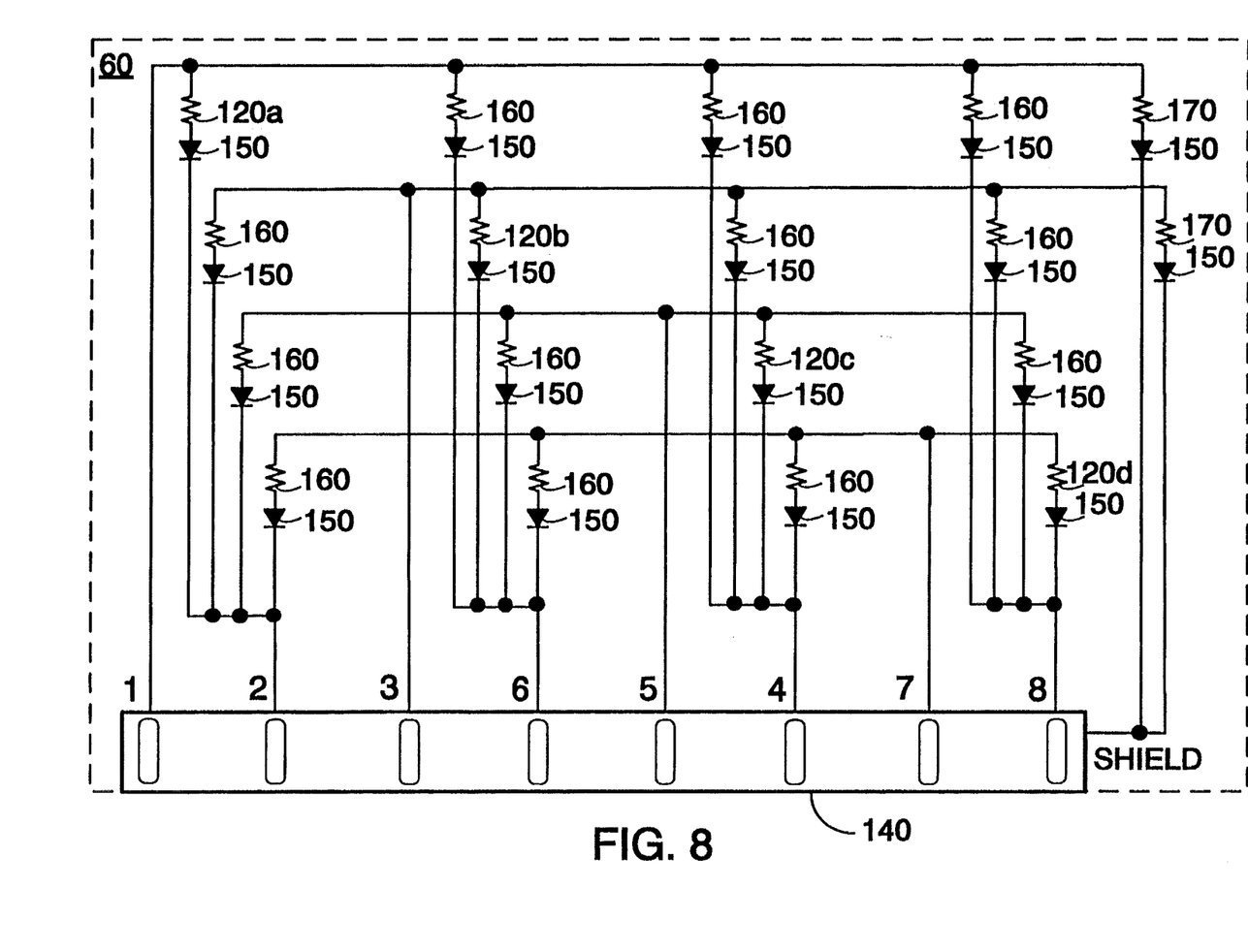
FIG. 8 is a circuit schematic of a LAN cable identifier according to the present invention.

In FIG. 8, there is shown a LAN cable identifier 60 according to the present invention. For each of the pairs 1-2, 3-6, 5-4, and 7-8 which correspond to the desired wire pairs in the LAN cable system, series diode-resistor combinations known as circuit elements are provided allowing the LAN cable test instrument 50 to detect a variety of errors. Each circuit element provides for the measurement of resistor value while not interfering with capacitance measurements of the LAN cable system. For example, a circuit element is comprised of resistor 120a and diode 150 disposed in series across pair 1-2. A d.c. bias voltage applied in a forward direction across the circuit element by the LAN cable test instrument 50 to pair 1-2 forward biases the diode 150 allowing current to flow and resistor 120a to be measured. Applied in the reverse direction, the d.c. bias voltage reverse biases the diode 150, causing the diode 150 to electrically resemble a very small capacitor. In this manner, the capacitance of a wire pair in the LAN cable system may be ascertained without substantial contribution of error from the circuit element coupled to the far end of the wire pair by maintaining a reverse d.c. bias voltage on the circuit element while measuring the capacitance of the LAN cable system with a superimposed a.c. test signal.

The diode 150 and the resistor 120a are disposed in series between pins 1 and 2 of the connector 140 corresponding the wire pair 1-2 of the LAN cable system to form an intra-pair circuit element. Similarly, a combination of the diode 150 and the resistor 120b are disposed in series between pins 3 and 6, a combination of the diode 150 and the resistor 120c are disposed in series between pins between pins 4 and 5, and a combination of the diode 150 and the resistor 120d are disposed in series between pins between 7 and 8. Resistors 120a-120d in each of these intra-pair circuit elements are assigned unique resistance values which are measured by the LAN cable test instrument 50 to identify the particular wire pair. In this way, the crossed-pair error 70b, open circuit error 70c, or short-circuit error 70d can be detected by comparing the measured resistance value to the expected value. Furthermore, the resistance value of the resistors 120a and 120b are assigned unique resistance values corresponding to a unique cable identifier number. The resistance of the resistors 120a and 120b is measured by the LAN cable test instrument 50 and compared with the predetermined set of values known for the set of cable identifiers in order to determine the proper cable identifier number. The use of two unique resistors corresponding to a unique cable identifier number in two separate circuit elements provides redundancy so that the LAN cable identifier number may still be determined when one intra-pair circuit element cannot be measured by the LAN cable test instrument 50 because of a wiring error in the LAN cable system.

The diode 150 in each intra-circuit element combination performs two functions. First, the diode 150 allows for the polarity reversal error 70e to be detected by providing a unidirectional current path in a predetermined direction which can be measured by the d.c. test current provided by the LAN cable test instrument 50. Second, the diode 150 electrically resembles a small capacitance value when the diode 150 is reverse-biased by a d.c. voltage provided by the LAN cable test instrument 50. In this way, the intra-circuit element contributes minimally to the capacitance measurement error of the LAN cable system.

The resistor 160 and the diode 150 are disposed in series between pin 1 and 4 in what is called an inter-pair circuit element which allows the LAN cable test instrument 50 to detect wiring errors that involve connections between desired wire pairs. For example, if a wiring error occurred in which wires 40 were transposed between pins 1 and 4 at one end of the cable, the LAN cable instrument 50, by measuring the value of resistor 160, would be able to diagnose the nature of the wiring error by comparing the measured value of the resistor 160 against a table of predetermined values for wiring errors. Similarly, other series combinations of inter-pair circuit elements consisting of the resistor 160 and diode 150 are disposed between pins 1 and 6, between pins 1 and 8, between pins 3 and 2, between pins 3 and 4, between pins 3 and 8, between pins 5 and 2, between pins 5 and 6, between pins 5 and 8, between pins 7 and 2, between pins 7 and 4, and between pins 7 and 6. Resistor 160 may be assigned a unique resistance value for each of the inter-pair circuit elements so that the nature of the wiring error can be more precisely determined by the identification of the inter-pair circuit element based on the measured resistance value which is compared to a table of known values by the LAN cable test instrument 50.

Inter-pair circuit elements are those circuit elements which are coupled between the pins of the desired pairs in order to provide to the LAN cable test instrument 50 further information as to the nature of the wiring error. The inter-pair circuit elements are designed so as not to interfere with the capacitance measurement by the LAN cable test instrument 50 which provides a d.c. bias voltage in the appropriate direction to reverse-bias the diode 150 in each inter-pair circuit element which then electrically resembles a very small capacitance value. All inter-pair circuit elements connected to a particular measurement node under test would be reverse-biased in the same way, thereby contributing minimally to the overall measurement error. Furthermore, the diode in each inter-pair circuit element serves to minimize the effect of a short-circuit error in the LAN cable system that affects one wire pair, thus allowing valid parameters to returned to the LAN cable test system in a more fault-tolerant manner.

A resistor 170 and the diode 150 are disposed in series between pin 1 and the SHIELD of the connector 140 in what is called a shield circuit element. A second shield circuit element, consisting of the resistor 170 and the diode 150, is disposed in series between pin 3 and the SHIELD of the connector 140 to provide a redundant means of detecting the open shield error 70f in the presence of wiring error in the LAN cable system that renders the first shield circuit element inoperable to the LAN cable test instrument 50.

Not all wiring errors can be diagnosed according to the circuit design of the present invention. For example, a wiring error in which a pair of wires 40 were connected to pins 2 and 4 would not be diagnosed by the LAN cable test instrument 50 because there is no inter-pair circuit element that covers that combination. The number of inter-pair circuit elements used in the present invention was arrived at empirically. Increasing the number of inter-pair circuit elements increases the complexity of the cable identifier 60, thereby increasing component count and consuming additional circuit board space while decreasing the ability of the LAN cable identifier to provide valid electrical parameters in the presence of short circuit wiring errors between other wire pairs. Inter-group circuit elements, while providing for the unique identification of wiring errors that may occur between any two particular pairs of wires, have the undesirable effect of providing lo possible parasitic paths that cause other circuit nodes to be affected in the present of short circuit errors, thereby decreasing the fault tolerance of the LAN cable identifier. These trade-offs in circuit complexity and fault tolerance were balanced against the desirable attribute of detecting more possible wiring errors to arrive at the present invention.

The commercial embodiment of the LAN cable identifier 60 was designed such that, with the orientation of all circuit elements determined by the orientation of the diode 150 in each circuit element, the anodes of the diodes 150 are coupled to the even numbered pins 2, 4, 6, and 8 of the connector 140, while the cathodes of the diodes 150 are coupled to the odd numbered pins 1, 3, 5, and 7 of the connector 140. In this arrangement, a d.c. bias voltage provided by the LAN cable test instrument 50 to reverse bias the diode 150 of any circuit element coupled across a wire pair being measured will also reverse bias all the diodes 150 of circuit elements that are incidentally connected to either wire of that wire pair. Short-circuit wiring errors 70d will not affect other measurement parameters of other wire pairs not directly involved.

It will be obvious to those having ordinary skill in the art that many changes may be made in the details of the above described preferred embodiments of the invention without departing from the spirit of the invention in its broader aspects. Greater or fewer numbers of inter-pair circuit elements may be used depending on the specific balance of the factors previously noted. Other unique component values, such as the junction voltage of a zener diode, may be used in place of the unique resistance values assigned to each circuit element to provide unique measurement parameters to the LAN cable test instrument. Therefore, the scope of the present invention should be determined by the following claims.

What I claim as my invention is:

1. A LAN cable identifier which, when connected to a far-end of a LAN cable having a plurality of pairs of conductors and having a near-end connected to a test instrument, forms a complete LAN cable test system, said LAN cable identifier comprising:
   (a) a plurality of pairs of input connectors, each of which defines an odd connector and an even connector and which corresponds to a pair of conductors of said LAN cable; and
   (b) an array of circuit elements, each of said circuit elements comprising a series combination of a diode and a resistor, arranged such that a plurality of circuit elements are connected at a common end to each of said even connectors, and the other end of each of said elements is connected to an odd connector to provide a unique combination of elements for each odd and even connector pair.

2. A LAN cable identifier according to claim 1 wherein each of said resistors has a predetermined resistance value to provide for the identification of each of said circuit elements by said test instrument.

3. A LAN cable identifier according to claim 1 wherein at least one of said resistors has a predetermined resistance value corresponding to a predetermined LAN cable identifier number to provide for the identification of said LAN cable identifier by said test instrument.

* * * * *